United States Patent
Nassar et al.

(10) Patent No.: US 8,736,013 B2
(45) Date of Patent: May 27, 2014

(54) SCHOTTKY DIODE WITH OPPOSITE-POLARITY SCHOTTKY DIODE FIELD GUARD RING

(75) Inventors: Chris Nassar, Portland, ME (US); Dan Hahn, Portland, ME (US); Sunglyong Kim, Falmouth, ME (US); Jongjib Kim, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/451,350

(22) Filed: Apr. 19, 2012

(65) Prior Publication Data

US 2013/0277791 A1 Oct. 24, 2013

(51) Int. Cl.
*H01L 29/66* (2006.01)
(52) U.S. Cl.
USPC .......... 257/484; 257/483; 257/E29.338
(58) Field of Classification Search
USPC .......... 257/484, 476, 477, 483, E29.338
See application file for complete search history.

(56) References Cited

U.S. PATENT DOCUMENTS

| | | | |
|---|---|---|---|
| 4,443,808 A * | 4/1984 | Kihara et al. | 257/479 |
| 5,091,324 A * | 2/1992 | Hsu et al. | 438/200 |
| 6,576,973 B2 | 6/2003 | Collard et al. | |
| 6,897,133 B2 | 5/2005 | Collard | |
| 7,101,739 B2 | 9/2006 | Lanois | |
| 2002/0105007 A1 | 8/2002 | Saggio et al. | |
| 2004/0164304 A1 | 8/2004 | Magri et al. | |
| 2005/0136613 A1 | 6/2005 | Poveda | |
| 2006/0138450 A1 | 6/2006 | Lanois et al. | |
| 2007/0102725 A1 | 5/2007 | Magri et al. | |
| 2010/0038711 A1 * | 2/2010 | Hsieh | 257/331 |
| 2010/0200945 A1 * | 8/2010 | Kim et al. | 257/471 |

* cited by examiner

*Primary Examiner* — Tucker Wright
(74) *Attorney, Agent, or Firm* — Brake Hughes Bellermann LLP (57) ABSTRACT

In one general aspect, an apparatus includes a metal or metal silicide contact layer disposed on an n-well region of a semiconductor substrate to form a primary Schottky diode. The apparatus includes a p-well guard ring region of the semiconductor substrate abutting the primary Schottky diode. The metal silicide contact layer has a perimeter portion extending over the p-well guard ring region of the semiconductor substrate and the p-well guard ring region has a doping level establishing a work function difference relative to the perimeter portion of the metal silicide contact layer to form a guard ring Schottky diode. The guard ring Schottky diode is in series with a p-n junction interface of the p-well region and the n-well region and the guard ring Schottky diode has a polarity opposite to that of the primary Schottky diode.

15 Claims, 9 Drawing Sheets

FIG. 1A

PRIOR ART

SCHOTTKY DIODE WITH OPPOSITE-POLARITY SCHOTTKY DIODE FIELD GUARD RING

TECHNICAL FIELD

This disclosure relates to electronic semiconductor devices. In particular this disclosure relates to Schottky barrier diodes fabricated on semiconductor substrates.

BACKGROUND

A Schottky diode is an electronic component that can be used in high frequency, fast switching or other electronic circuits, for example, as a RF mixer or detector diode, a power rectifier, or a clamp diode. The Schottky diode can exploit a rectifying barrier at a metal-semiconductor interface (i.e., the mismatch in the energy position of the majority carrier band edge of a semiconductor and the metal Fermi level across a metal-semiconductor interface) for its operation. Conduction in the Schottky diode is controlled by thermionic emission of majority carriers over the barrier. The Schottky diode can thus be a majority carrier device with a switching speed which is not limited by minority carrier effects.

A Schottky diode may be fabricated as a discrete component or incorporated in an integrated semiconductor circuit. A typical Schottky diode structure can include a metal or metal silicide conductive layer in rectifying contact with a semiconducting layer. Even though the Schottky diode can have good forward switching characteristics, in a reverse biased Schottky diode, large electric fields at the edges of the contact layer or rectifying barrier can lead to relatively low breakdown voltages and/or relatively poor leakage characteristics. To address relatively large edge electric fields that may be present, in conventional Schottky diode structures, the edge of the Schottky contact layer is placed on a field relief guard ring (i.e. a diffused oppositely-doped semiconductor region). The guard ring, which is in ohmic contact with the metal or metal silicide conductive layer, can improve reverse breakdown characteristics of the Schottky diode. The guard ring, however, can introduce a parasitic bipolar junction transistor in the structure. The parasitic bipolar junction transistor in action or active state can amplify small emitter-base currents to produce relatively large substrate currents to degrade the forward characteristics of the Schottky diode.

SUMMARY

In one general aspect, an apparatus includes a silicon substrate with an insulating element abutting a surface area of the silicon substrate. An n-well region is disposed in the silicon substrate. Further, a p-well guard ring region is disposed in the silicon substrate between the n-well region and the insulating element. A conductive layer (e.g., a metal silicide layer) is disposed or placed on the surface contact area. The disposed conductive layer has a middle portion and an edge portion that extends laterally from the middle portion to the insulating element. The middle portion of the conductive layer forms an n-type rectifying contact with the n-well region of the silicon substrate. The middle portion of the conductive layer and the n-well region form an n-type Schottky diode. Further, the edge portion of the conductive layer forms a p-type rectifying contact with a p-well guard ring region. The p-type rectifying contact abuts the n-type rectifying contact and extends from the n-type rectifying contact to the insulating element. The edge portion of the conductive layer and the p-well guard ring region form a p-type guard ring Schottky diode that is electrically in parallel with the n-type Schottky diode.

In a general aspect, an electronic device includes a semiconductor substrate having a surface contact area with an outer edge thereof defined by an insulating element disposed on the semiconductor substrate. The semiconductor substrate has a doped well region and an oppositely-doped well region underlying the surface contact area. A conductive layer is disposed on the surface contact area. The conductive layer has a middle portion and an edge portion. Both the middle portion and the edge portion are in contact with the semiconductor substrate. The edge portion extends laterally from the middle portion to the outer edge of the surface contact area. The middle portion of the conductive layer forms a first rectifying contact with the doped well region of the semiconductor substrate. The middle portion of the conductive layer and the doped well region form a primary Schottky diode. Further, the edge portion of the conductive layer forms a second rectifying contact with the oppositely-doped well region of the semiconductor substrate. The second rectifying contact extends continuously from the first rectifying contact to the outer edge of the surface contact area. The edge portion of the conductive layer and the oppositely-doped well region form a guard ring Schottky diode that is in parallel with the primary Schottky diode and in series with a p-n junction interface of the doped well region and the oppositely-doped well region of the semiconductor substrate. The guard ring Schottky diode has a polarity opposite to that of the primary Schottky diode.

The electronic device is configured so that when the primary Schottky diode is forward biased, the guard ring Schottky diode is automatically reverse biased electrically isolating the oppositely-doped guard ring region from the conductive contact layer to inhibit parasitic bipolar junction transistor action (e.g., amplification) between the oppositely-doped guard ring region, the doped well region, and the substrate. The electronic device is further configured so that when the primary Schottky diode is reverse biased, the guard ring Schottky diode is automatically forward biased so as to reverse bias the p-n junction interface of the doped and oppositely-doped well regions. Such reverse bias of the p-n junction inhibits edge electric fields at the conductive contact layer and increases a breakdown voltage of the primary Schottky diode.

In a general aspect, a method provides a semiconductor substrate having a surface contact area with an outer edge delineated by an insulating element disposed on the semiconductor substrate. The surface contact area overlies a doped well region of the semiconductor substrate and an oppositely-doped well region of the semiconductor substrate. The oppositely-doped well region lies along the outer edge of the surface contact area and abuts the doped well region of the semiconductor substrate.

The method further includes disposing a conductive layer on the surface contact area. The conductive layer has a middle portion and an edge portion. The middle portion of the conductive layer in the surface contact area is in a first rectifying contact with the doped well region of the semiconductor substrate to form a primary Schottky diode. The edge portion of the conductive layer in the surface contact area is in a second rectifying contact with the oppositely-doped well region of the semiconductor substrate to form an opposite-polarity guard ring Schottky diode. The edge portion of the conductive layer in contact with the oppositely-doped well region extends laterally from the middle portion of the conductive layer up to the outer edge of the surface contact area. The opposite-polarity guard ring Schottky diode is in series with a p-n junction interface of the doped well region and the oppositely-doped well region of the semiconductor substrate.

Features and details of one or more implementations are set forth in the accompanying drawings and the description below. Other features will be apparent from the description and drawings, and from the claims.

BRIEF DESCRIPTION OF THE DRAWINGS

Throughout the figures, unless otherwise stated, the same reference numerals and characters are used to denote like features, elements, components, or portions of the illustrated embodiments.

DETAILED DESCRIPTION

In the following description of exemplary embodiments, reference is made to the accompanying drawings, which form a part hereof. It will be understood that embodiments described herein are exemplary, but are not meant to be limiting. Further, it will be appreciated that the solutions described herein can be practiced or implemented by other than the described embodiments. Modified embodiments or alternate embodiments may be utilized, in the spirit and scope of the solutions described herein.

Figure 1A:
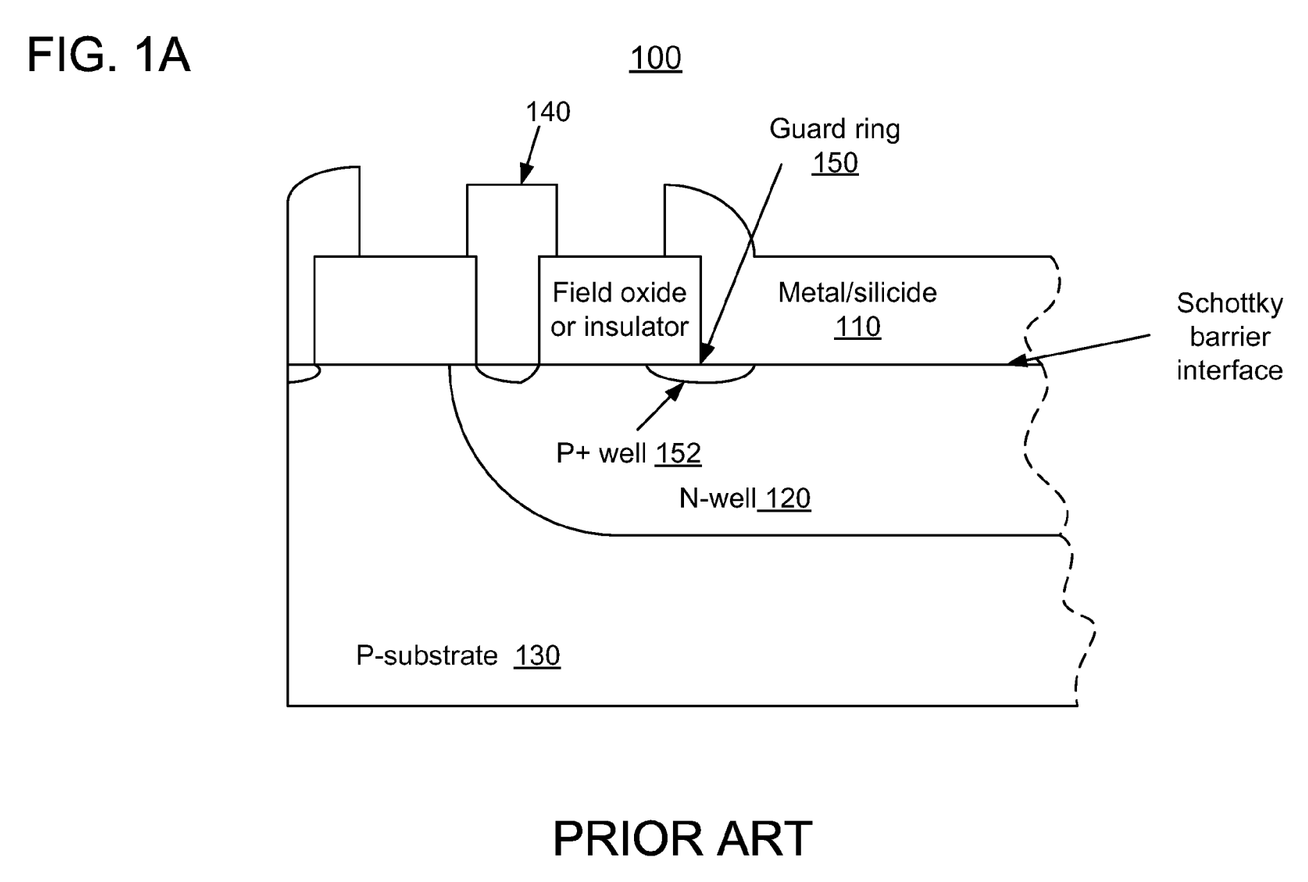
FIGS. 1A and 1B illustrate schematic sectional views of conventional prior art n-type Schottky diode structures that employ highly doped p+ regions as field relief guard rings that are in ohmic contact with the diode anode.
Figure 1B:
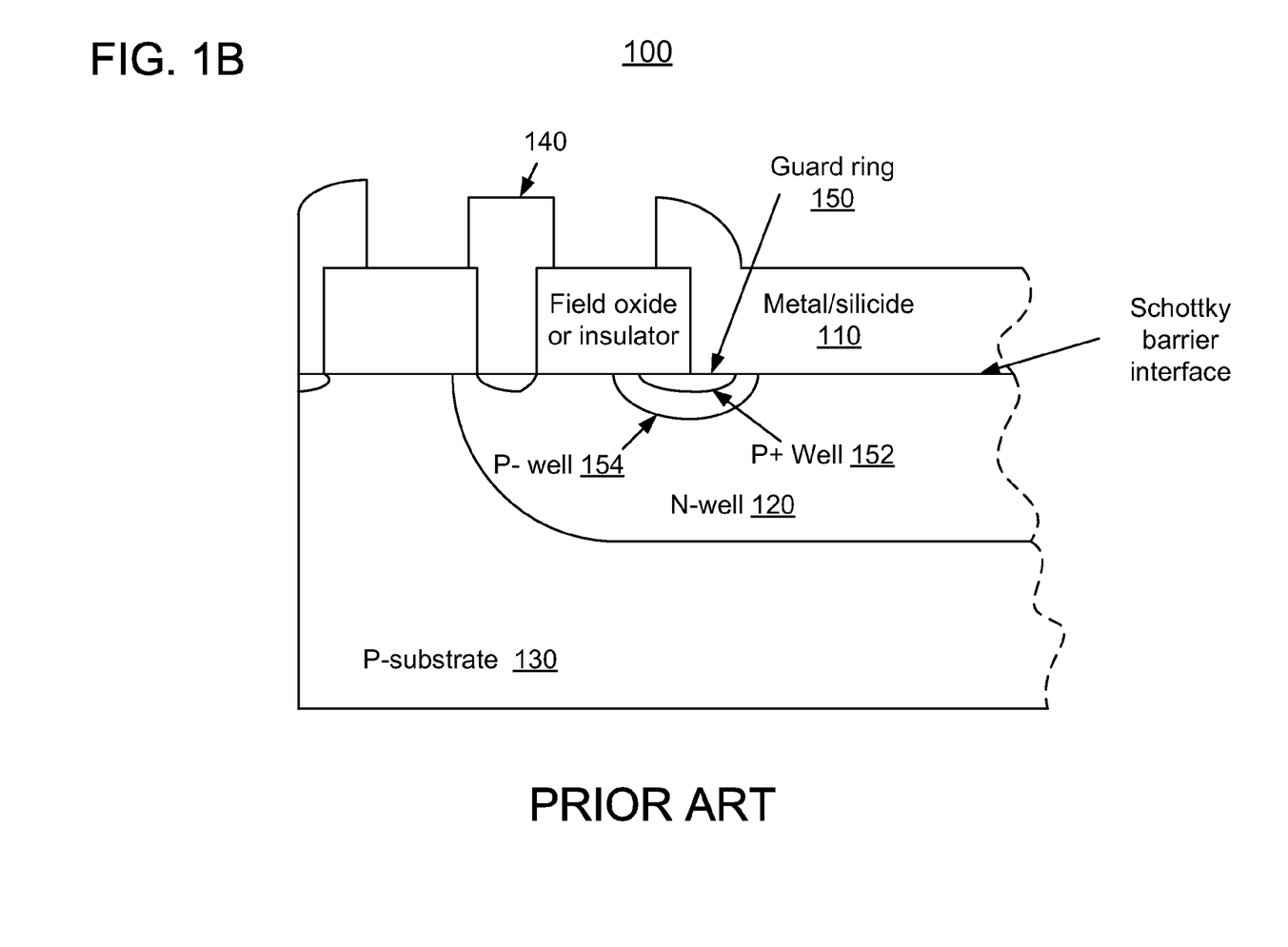

FIGS. 1A and 1B are sectional views of conventional n-type Schottky diodes that use field guard rings, which are in ohmic contact with the barrier metal, to improve reverse breakdown characteristics of the diodes. FIG. 1A shows a Schottky diode 100 formed by disposing a metal/silicide contact layer 110 on an n-well region 120 of a p-type silicon substrate 130. The work function differences between the metal/silicide contact layer 110 and semiconductor 130 provide a rectifying Schottky barrier interface for current flow between metal/silicide contact 110 and n-well region 120. Metal/silicide contact 110 serves as an anode, and an electrical contact 140 made to n-well region 120 serves as a cathode for Schottky diode 100. A p+ diffused region 152, which is disposed along an edge of the metal silicide/semiconductor interface, serves as field relief guard ring 150 to limit edge electrical fields when Schottky diode 100 is reverse biased. FIG. 1B shows a version of Schottky diode 100 in which field guard ring 150 is formed by a highly doped p+ diffused region 152 disposed inside a p-well region 154. In either case (i.e. FIG. 1A or 1B), because of the high doping levels in the p+ diffused region 152, field relief guard ring 150 is in ohmic contact with or electrically short circuited to metal/silicide contact 110. This electrical short circuit relieves edge fields and increases the reverse voltage breakdown of Schottky diode 100. Field guard ring 150, which is ohmically or electrically connected to metal/silicide contact 110, can function as an emitter for a parasitic p-n-p bipolar transistor device leading to undesirable substrate current in forward bias operation of the conventional Schottky diode 100.

In accordance with the principles of the solutions described herein, Schottky diode structures may include Schottky barriers or rectifying contacts with both p- and n-well regions of a semiconductor substrate. Formation of suitable Schottky barriers or rectifying contacts (i.e., metal-semiconductor work function differences) with both p- and n-well regions of the semiconductor substrate may be controlled by choice of p- and n-well doping levels, and choice of contact metals. Examples of metal-semiconductor pairs that may have suitable work function characteristics for forming Schottky barriers or rectifying contacts with both p- and n-well semiconductor regions include cobalt silicide-silicon, platinum silicide-silicon, titanium-silicon, tungsten-silicon, aluminum-silicon, gold-silicon, etc.

Figure 2A:
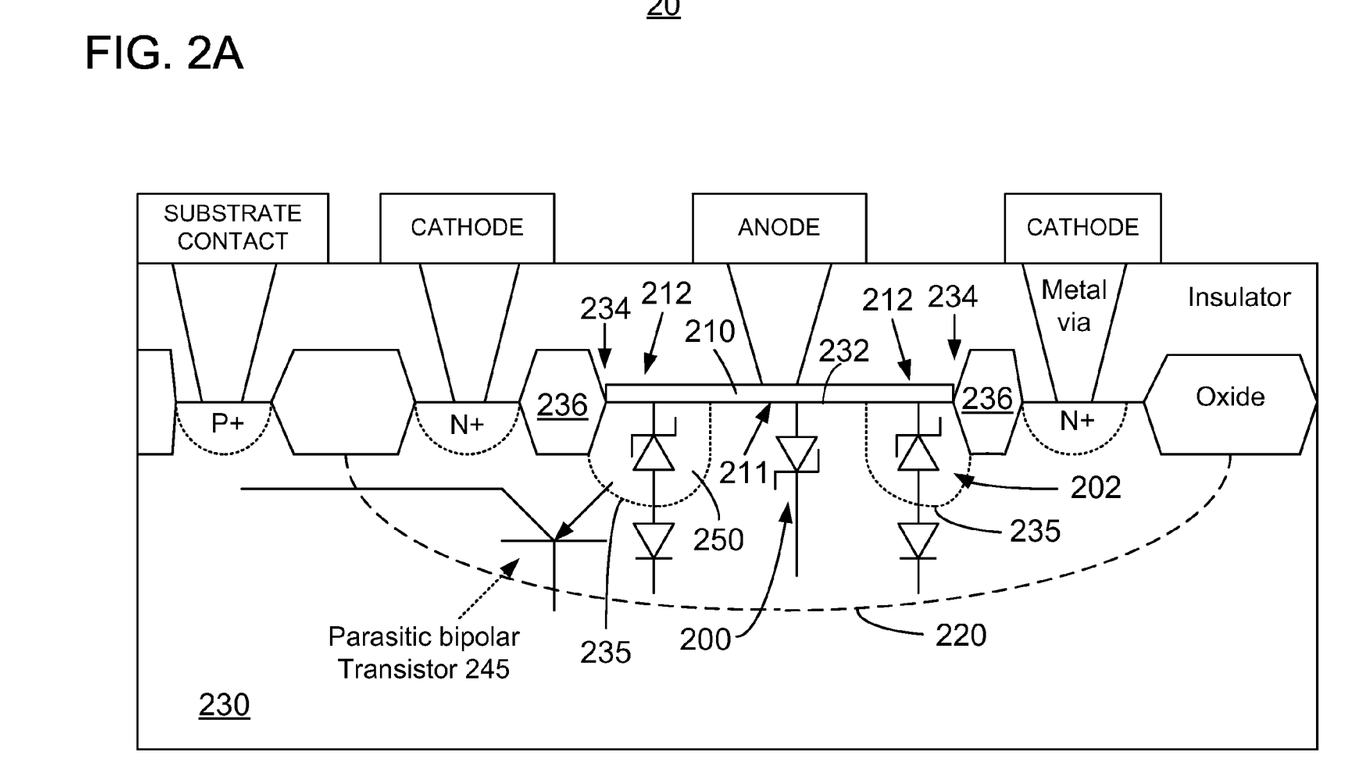
FIG. 2A illustrates a schematic sectional view of an n-type Schottky diode with a lightly doped p-well field relief guard ring that is in rectifying contact with the diode anode, in accordance with the principles of the solutions described herein.

FIG. 2A shows an example Schottky diode structure 20 in which metal or metallic contact materials (e.g., contiguous or common metal contact materials) form Schottky barriers or rectifying contacts with both p- and n-type regions of a semiconductor substrate. Depending on the particular type of semiconductor and the doping levels p- and n-type regions of the semiconductor substrate, suitable metal or metallic contact materials may, for example, include aluminum, gold, molybdenum, cobalt silicide, palladium silicide, platinum silicide, titanium silicide.

Example Schottky diode structure 20 includes a Schottky diode 200 (hereinafter referred to as "primary" Schottky diode 200) with a field guard ring, which because of metal-to-semiconductor work function differences also forms another Schottky barrier or rectifying contact with the primary diode's metal electrode. In particular, FIG. 2A shows a sectional view of an example Schottky diode structure 20 that may be fabricated with a p-type semiconductor substrate 230 using semiconductor device or circuit fabrication processes. P-type semiconductor substrate 230 has a surface contact area 232 with outer edges 234 thereof circumscribed by an insulating element (e.g., field oxide 236) disposed on the semiconductor substrate. Schottky diode structure 20 may be formed by depositing a metal or metal silicide layer 210 in surface contact area 232 on an n-well region 220 in p-type semiconductor substrate 230. Metal or metal silicide layer 210 may be any suitable metal or metal silicide layer that results in a desired Schottky barrier at its interface with the surface of n-well region 220 of p-type semiconductor substrate 230. Primary Schottky diode 200, which is formed by the metal/n-type semiconductor junction, is schematically represented in the figure by a standard electrical circuit symbol for a Schottky diode.

External electrical terminals or connections to the semiconductor device portions of primary Schottky diode 200 may be fabricated using semiconductor circuit processing elements and techniques, including, for example, photolithography, field oxide isolations, p+ and n+ diffused regions for ohmic contact with semiconductor material, blanket and planarizing insulating coatings, metal-filled vias, and patterned metallization techniques. Exemplary electrical terminals for Schottky diode 200 that are labeled as "Anode" and "Cathode," and also a substrate contact terminal labeled as "Substrate Contact," are shown in FIG. 2A. These terminals may be electrically connected to metal or metal silicide layer 210 or other semiconductor contacts using, for example, metal-filled vias, as shown in the figure.

With reference to FIG. 2A, a diffused lightly doped p-well region 250, which serves as a field guard ring, abuts (e.g., is adjacent to) the main body of primary Schottky diode 200. An edge perimeter portion 212 of metal or metal silicide layer 210 extends over and is in contact with surface portions of p-well region 250. An edge perimeter portion 212 extends laterally from a middle portion 211 (also can be referred to as a middle lateral portion) of metal silicide layer 210 up to edges 234 of surface contact area 232. The dopant concentration of the p-well region 250 and the type of the metal or metal silicide layer 210 determine whether the metal-semiconductor contact is ohmic or rectifying. For Schottky diode 200, the doping level of p-well region 250 and the type of metal or metal silicide material are suitably selected so that all of edge perimeter portion 212 of metal or metal silicide layer 210 forms a rectifying (i.e., Schottky barrier) contact with p-well region 250. It will be noted that all regions of semiconductor substrate 230 (e.g., p-well region 250) in contact with metal or metal silicide layer 210 may have dopant concentrations that are kept below levels that could lead to inadvertent formation of an ohmic contact. A rectifying contact may, for example, be obtained when the doping level of p-well region 250 is selected to be less than $10^{16}$ atoms/cm$^3$ and metal or metal silicide layer 210 is a cobalt silicide layer. This rectifying contact forms a p-type Schottky diode 202 having a common anode with primary Schottky diode 200. P-type Schottky diode 202 may be referred to as the field relief or guard ring Schottky diode 202 herein.

Further, it will be noted that p-type Schottky diode 202 has the opposite polarity of primary Schottky diode 200. Further, p-type Schottky diode 202 is in series with a junction 235 of p-well region 250 and n-well region 220. Junction 235 can act as the emitter-base junction of a parasitic bipolar p-n-p transistor having substrate 230 as its collector. P-type Schottky diode 202, the junction of p-well region 250 and n-well region 220, and the parasitic bipolar p-n-p transistor are schematically represented in FIGS. 2A-2C using standard electrical circuit symbols for a Schottky diode, a diode, and a bipolar junction transistor, respectively.

Figure 2B:
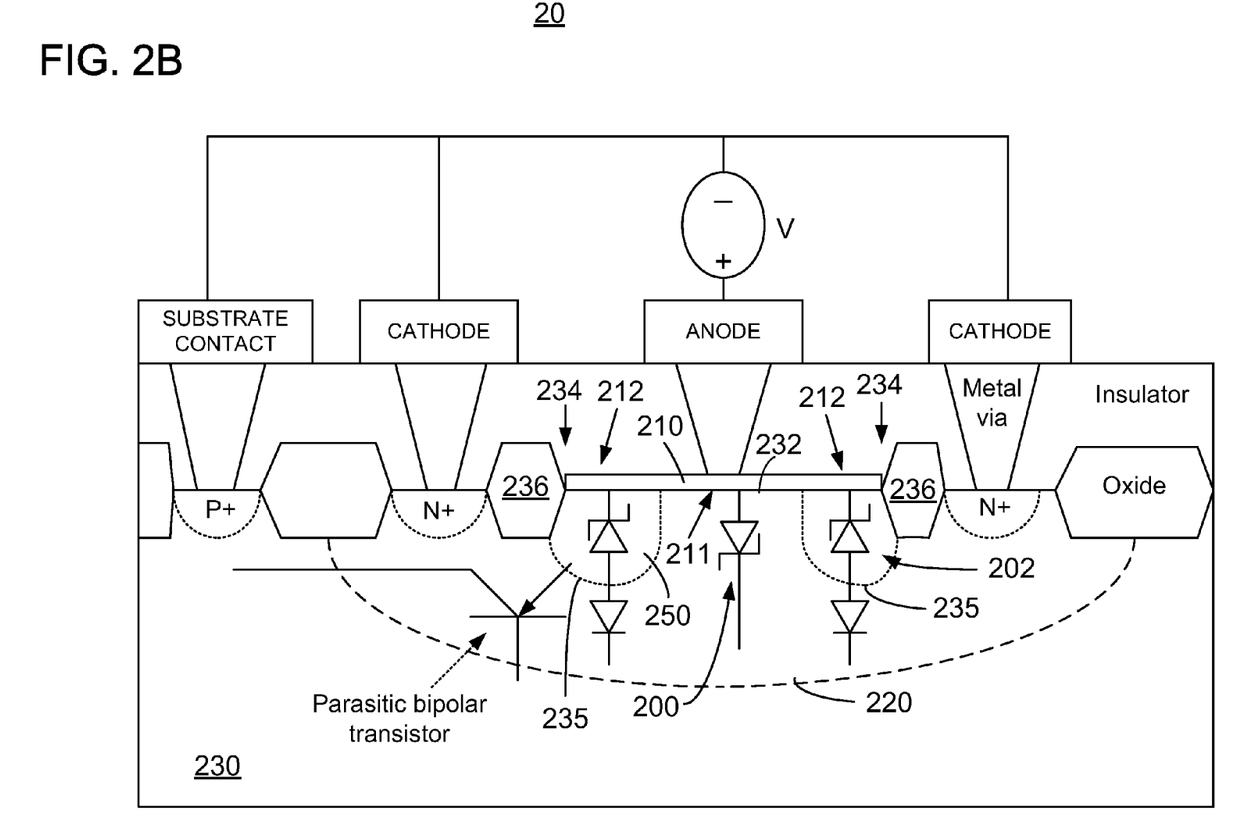
FIGS. 2B and 2C illustrate the n-type Schottky diode of FIG. 2A configured for forward bias and reverse bias operation, respectively, in accordance with the principles of the solutions described herein.

FIG. 2B shows primary Schottky diode 200 configured for (e.g., wired for) forward bias operation. When a positive voltage is applied to the anode terminal, primary n-type Schottky diode 200 is in an on-state operating in forward mode. Simultaneously, the positive anode voltage reverse biases field relief guard ring p-type Schottky diode 202 cutting off or disconnecting p-well region 250 electrically from the anode/metal silicide layer 210. This cut-off prevents base-emitter junction 235 of the parasitic bipolar p-n-p transistor from turning or switching on and prevents increases in substrate current in the forward bias operation of primary Schottky diode 200.

Figure 2C:
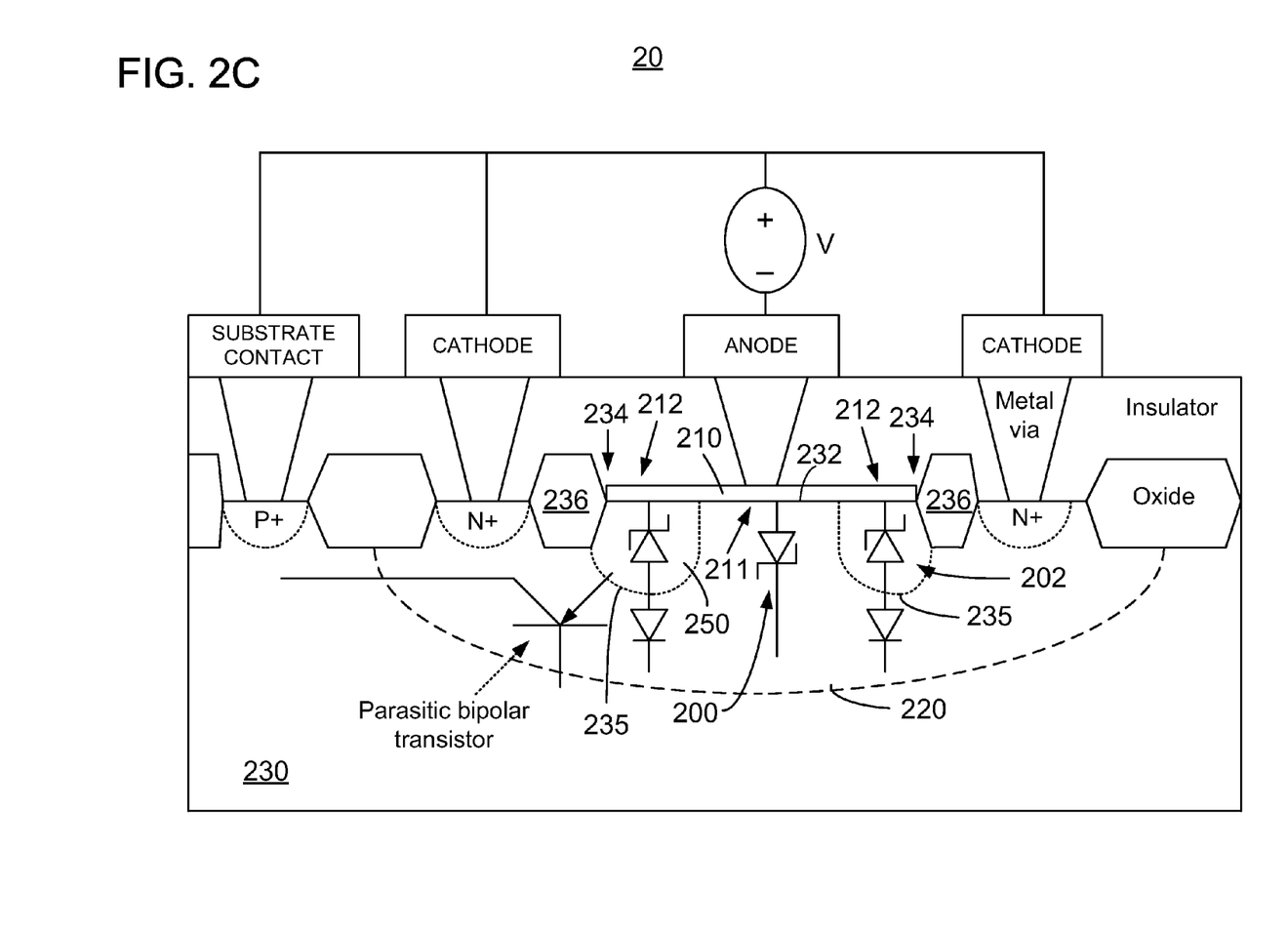

FIG. 2C shows primary Schottky diode 200 wired for reverse bias operation. When a negative voltage is applied to the anode terminal, primary n-type Schottky diode 200 is in an off-state operating in reverse mode. Simultaneously, the applied negative anode voltage applied to anode 210 forward biases field relief guard ring p-type Schottky diode 202. The forward bias of field relief guard ring p-type Schottky diode 202 reverse biases junction 235 of p-well region 250 and n-well region 220. The reverse bias of junction 235 provides suitable conditions for the typical guard ring function of reducing electrical fields at the edges of metal or metal silicide layer 210 in the reverse bias operation of primary Schottky diode 200.

Figure 3:
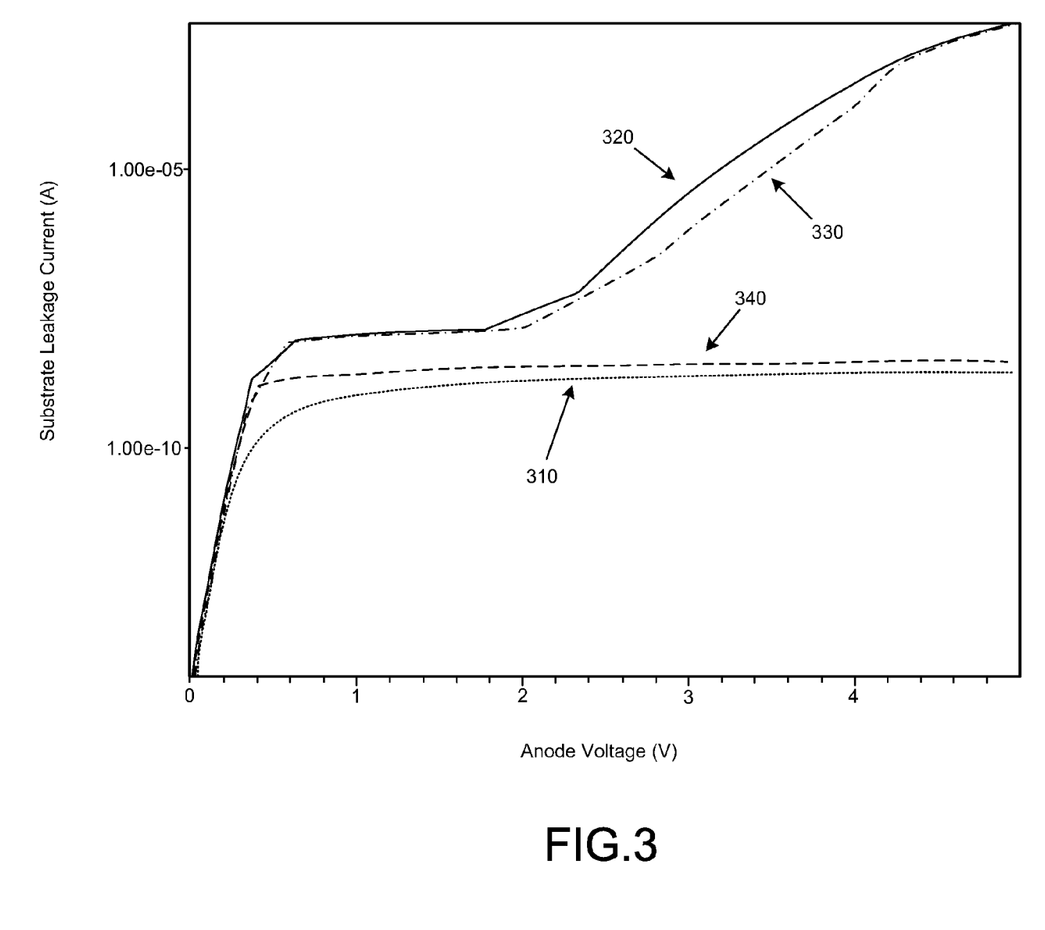
FIG. 3 is a graph of measured substrate leakage currents as a function of applied anode voltage under forward bias conditions for a variety of test Schottky diode structures including an n-type Schottky diode of the type shown in FIG. 2A, in accordance with the principles of the solutions described herein.

FIG. 3 is a graph of substrate leakage current measurements made under forward bias for various test Schottky diode structures with and without field guard rings, including test diode structures of the types described, for example, with reference to FIG. 2A. The substrate leakage current measurements (310-340) shown include those for a Schottky diode with no guard ring (310), a Schottky diode with a p+ guard ring of the type described with reference to FIG. 1A (320), a Schottky diode with a p+ in a p-well guard ring of the type described with reference to FIG. 1B (330), and a Schottky diode (e.g., diode 200) with an opposite-polarity Schottky diode of the type described with reference to FIGS. 2A-2C (340). The graph shows a marked increase (e.g., at anode voltages above 0.6 volts) in substrate leakage currents 320 and 330 for Schottky diodes with a conventional p+ guard ring and a p+ in a p-well guard ring, respectively, compared, for example, to substrate leakage current 310 for a Schottky diode having no guard ring. This increase, which is noticeable in the graph for anode voltages greater than about 2.0 volts, may be attributed to the creation and activation of parasitic bipolar junction transistors by the p-doped well guard rings. In contrast, the graph demonstrates the forward bias substrate leakage current 340 for the Schottky diode with an opposite-polarity Schottky diode is comparable to the substrate leakage current 310 of the Schottky diode having no field guard ring. The current measurements confirm that the opposite-polarity Schottky diode prevents activation of the parasitic bipolar transistor that might increase substrate leakage currents under forward bias conditions.

Figure 4:
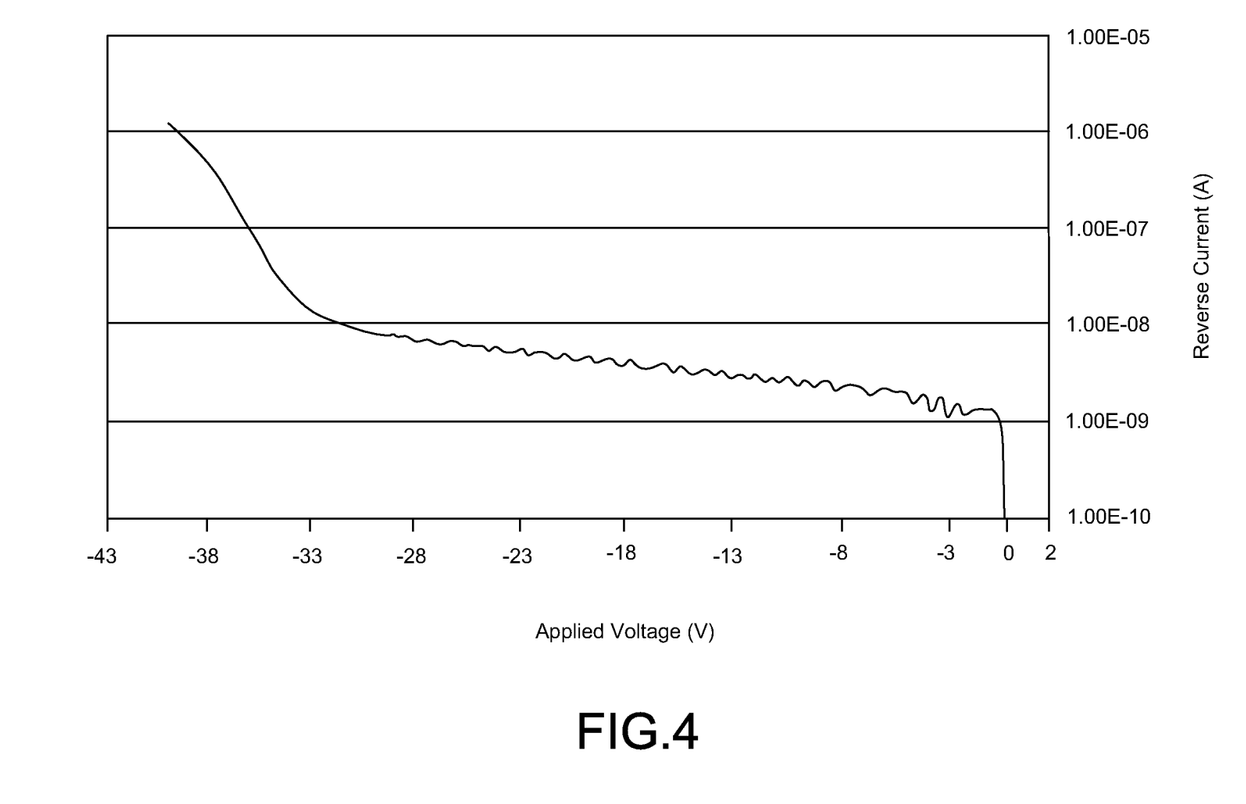
FIG. 4 is a graph of reverse current as a function of applied anode voltage measured under reverse bias conditions for a test n-type Schottky diode of the type shown in FIG. 2A, in accordance with the principles of the solutions described herein.
Figure 5:
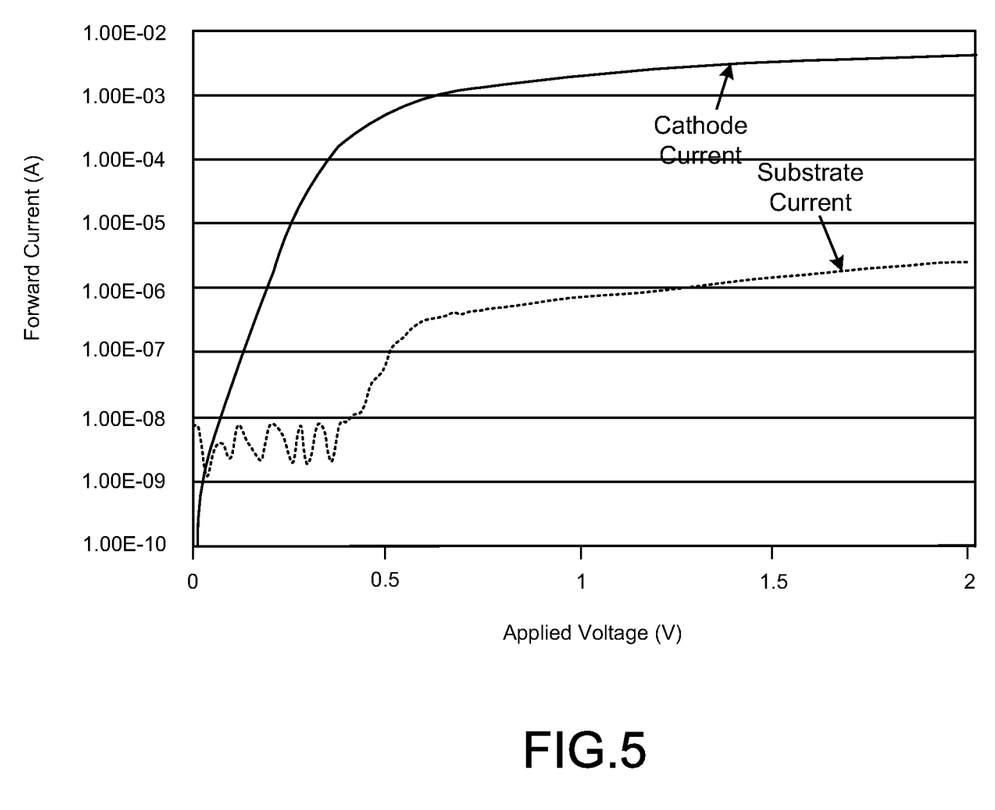
FIG. 5 is a graph of cathode and substrate currents as a function of applied anode voltage measured under forward bias conditions for a test n-type Schottky diode of the type shown in FIG. 2A, in accordance with the principles of the solutions described herein.

FIGS. 4 and 5 are graphs, which show reverse and forward currents, respectively, measured as a function of applied voltage for a test Schottky diode with an opposite-polarity Schottky diode of the type described with reference to FIGS. 2A-2C. The test Schottky diode was fabricated on a p-type silicon substrate using cobalt silicide as the rectifying contact. The rectifying contact area of the diode was about 50 μm$^2$, and N-well and p-well doping levels were in the range of about $10^{15}$ to $10^{16}$ atoms/cm$^3$.

The reverse current-voltage curve for the test Schottky diode shown in FIG. 4 demonstrates that the opposite-polarity Schottky diode p-well guard ring, like a conventional p+ guard ring or a p+ in a p-well guard ring, is effective in increasing reverse breakdown voltage of the test Schottky diode to well above an expected range of diode operating voltages. In particular, the reverse current-voltage curve shown in FIG. 4 shows that the reverse voltage breakdown voltage of the test Schottky diode exceeds about 33 volts, which is well above the expected range of operating voltage of ±2 volts.

FIG. 5 shows measured forward cathode and substrate current-voltage curves for the same test Schottky diode for which the reverse current-voltage curve shown in FIG. 4. The cathode current curve demonstrates that the test Schottky diode has expected forward current characteristics turning on when the applied voltage exceeds the Schottky barrier height of about 0.4 volts. As seen in the figure, the substrate current remains about three orders of magnitude less than the cathode current over the entire range of forward bias operation (0-2 volts). These current curves demonstrate the p-well guard ring forming the opposite-polarity Schottky diode, unlike a conventional p+ guard ring or a p+ in a p-well guard ring, is effective in suppressing increases in substrate currents in forward operation of the test Schottky diode, and also in increasing reverse breakdown voltage of the Schottky diode to about 33 volts.

Figure 6:
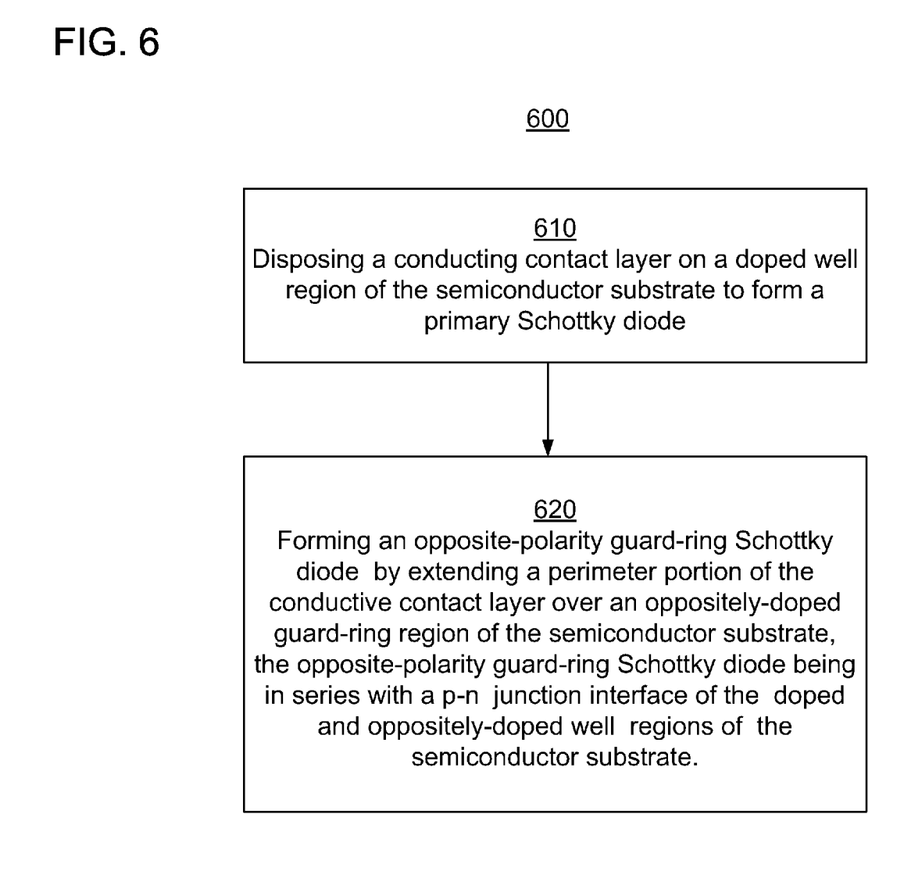
FIG. 6 is a flow diagram illustrating a method for maintaining good Schottky diode performance characteristics in both reverse and forward modes of operation, in accordance with the principles of the solutions described herein.

FIG. 6 shows an example method 600 for maintaining performance characteristics of a Schottky diode over a full range of operating voltages in both reverse and forward modes of operation. Method 600 includes disposing a conducting contact layer on a doped well region of the semiconductor substrate to form a primary Schottky diode (610), and forming an opposite-polarity guard ring Schottky diode by extending a perimeter portion of the conductive contact layer over an oppositely-doped guard ring region of the semiconductor substrate (620). The opposite-polarity guard ring Schottky diode is in series with a p-n junction interface of the doped and oppositely-doped well regions of the semiconductor substrate. The doping levels in semiconductor substrate may be sufficiently low so that no portion of the conductive contact layer makes an ohmic contact or other contact with the semiconductor substrate that could, short the opposite-polarity guard ring Schottky diode. When the primary Schottky diode is forward biased in operation, method 600 further includes, reverse biasing the guard ring Schottky diode to electrically cut off the oppositely-doped guard ring region from the conductive contact layer so as to inhibit parasitic bipolar transistor action between the oppositely-doped guard ring region, the doped well region, and the semiconductor substrate. When the primary Schottky diode is reverse biased in operation, method 600 further includes forward biasing the guard ring Schottky diode to reverse bias the p-n junction interface of the doped and oppositely-doped well regions. The reverse bias of the p-n junction interface provides conditions which inhibit edge electric fields at the conductive contact layer and increase a breakdown voltage of the primary Schottky diode.

In method 600, the conductive contact layer may be any suitable metal or metal silicide that forms respective Schottky barriers at the junctions with both the n-well and p-well regions. The conductive contact layer may, for example, be a cobalt silicide layer. Depending on the particular type of semiconductor and the doping levels used in the electronic device, other suitable conductive layers may, for example, include aluminum, gold, molybdenum, palladium silicide, platinum silicide, titanium silicide.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
   an insulating element abutting a surface area of a silicon substrate;
   an n-well region disposed in the silicon substrate;
   a p-well guard ring region disposed in the silicon substrate between the n-well region and the insulating element; and
   a conductive layer disposed on the surface area of the silicon substrate, the conductive layer having a middle portion and an edge portion, the middle portion of the conductive layer forming an n-type rectifying contact with the n-well region of the silicon substrate, the middle portion of the conductive layer and the n-well region forming an n-type Schottky diode,
   the edge portion of the conductive layer forming a p-type rectifying contact with the p-well guard ring region, the p-type rectifying contact abutting the n-type rectifying contact, the p-type rectifying contact extending from the n-type rectifying contact and abutting the insulating element, the edge portion of the conductive layer and the p-well guard ring region forming a p-type guard ring Schottky diode electrically in parallel with the n-type Schottky diode;
   an anode structure disposed over the surface area of the silicon substrate in electrical contact with the conductive layer, the anode structure forming a first terminal of the p-type guard ring Schottky diode electrically in parallel with the n-type Schottky diode.

2. The apparatus of claim 1, wherein the n-well region, the p-well guard ring region and conductive layer are configured so that when the n-type Schottky diode is forward biased, the p-type guard ring Schottky diode is reverse biased electrically disconnecting the p-well guard ring region from the conductive layer to inhibit parasitic bipolar transistor action between the p-well guard ring region, the n-well region, and the silicon substrate.

3. The apparatus of claim 1, wherein the n-well region, the p-well guard ring region and the conductive layer are configured so that when then-type Schottky diode is reverse biased, the p-type guard ring Schottky diode is forward biased to reverse bias a p-n junction interface of the p-well guard ring region and the n-well region to inhibit edge electric fields and increase a breakdown voltage of the n-type Schottky diode.

4. The apparatus of claim 3, wherein the n-well region has a donor dopant concentration of about $10^{14}$ to $10^{16}$ atoms/$cm^3$.

5. The apparatus of claim 3, wherein the p-well guard ring region has an acceptor dopant concentration of about $10^{16}$ atoms/$cm^3$ or less.

6. The apparatus of claim 5, wherein the conductive layer is at least one of a cobalt silicide layer, a titanium silicide layer, a platinum silicide layer and a palladium silicide layer.

7. An electronic device, comprising:
   a semiconductor substrate having a surface contact area with an outer edge defined by an insulating element disposed on the semiconductor substrate, the semiconductor substrate having a doped well region and an oppositely-doped well region underlying the surface contact area; and
   a conductive layer disposed on the surface contact area, the conductive layer having a middle portion and an edge portion, both the middle portion and the edge portion being in contact with the semiconductor substrate, the edge portion extending laterally from the middle portion to the outer edge of the surface contact area, the middle portion of the conductive layer forming a first rectifying contact with the doped well region of the semiconductor substrate, the middle portion of the conductive layer and the doped well region forming a primary Schottky diode, the edge portion of the conductive layer forming a second rectifying contact with the oppositely-doped well region of the semiconductor substrate, the second rectifying contact extending continuously from the first rectifying contact to the outer edge of the surface contact area and abutting the insulating element, the edge portion of the conductive layer and the oppositely-doped well region forming a guard ring Schottky diode in parallel with the primary Schottky diode and in series with a p-n junction interface of the doped well region and the oppositely-doped well region of the semiconductor substrate, the guard ring Schottky diode having a polarity opposite a polarity of the primary Schottky diode.

8. The electronic device of claim 7, wherein the doped well region, the oppositely-doped well region, and the semiconductor substrate are configured so that when the primary Schottky diode is forward biased the guard ring Schottky diode is reverse biased electrically disconnecting the oppositely-doped guard ring well region from the conductive layer to inhibit parasitic bipolar transistor action between the oppositely-doped well region, the doped well region, and the semiconductor substrate.

9. The electronic device of claim 7, wherein the doped well region, the oppositely-doped well region, and the semiconductor substrate are configured so that when the primary Schottky diode is reverse biased, the guard ring Schottky diode is forward biased so as to reverse bias the p-n junction interface of the doped and oppositely-doped guard ring well regions to inhibit edge electric fields at the conductive layer and increase a breakdown voltage of the primary Schottky diode.

10. The electronic device of claim 7, wherein the doped well region is an n-well region of the semiconductor substrate and the primary Schottky diode is an n-type Schottky diode, and the oppositely-doped well region is a p-well region of the semiconductor substrate and the guard ring Schottky diode is a p-type Schottky diode.

11. The electronic device of claim 7, wherein the doped well region is a p-well region of the semiconductor substrate and the primary Schottky diode is a p-type Schottky diode, and the oppositely-doped well region is an n-well region of the semiconductor substrate and the guard ring Schottky diode is an n-type Schottky diode.

12. The electronic device of claim 7, wherein the semiconductor substrate is a silicon substrate, and wherein the doped well region has a donor concentration of about $10^{14}$ to $10^{16}$ atoms/cm$^3$.

13. The electronic device of claim 7, wherein the semiconductor substrate is a silicon substrate, and wherein the oppositely-doped well region has an acceptor concentration of about $10^{16}$ atoms/cm$^3$ or less.

14. The electronic device of claim 7, wherein the conductive layer is a cobalt silicide layer.

15. The electronic device of claim 7, wherein the conductive layer is at least one of aluminum, gold, molybdenum, palladium silicide, platinum silicide, titanium silicide and/or a cobalt silicide layer.

* * * * *

UNITED STATES PATENT AND TRADEMARK OFFICE
CERTIFICATE OF CORRECTION

PATENT NO.        : 8,736,013 B2
APPLICATION NO.   : 13/451350
DATED             : May 27, 2014
INVENTOR(S)       : Chris Nassar et al.

Page 1 of 1

It is certified that error appears in the above-identified patent and that said Letters Patent is hereby corrected as shown below:

In the Claims

In column 8, line 43, in claim 3, delete "then-type" and insert -- the n-type --, therefor.

Signed and Sealed this
Fifth Day of August, 2014

Michelle K. Lee
*Deputy Director of the United States Patent and Trademark Office*